(12) United States Patent
Ko et al.

(10) Patent No.: US 7,897,505 B2
(45) Date of Patent: Mar. 1, 2011

(54) METHOD FOR ENHANCING ADHESION BETWEEN LAYERS IN BEOL FABRICATION

(75) Inventors: Chung-Chi Ko, Nantou (TW); Lih-Ping Li, Hsinchu (TW); Yung-Cheng Lu, Taipei (TW); Hui-Lin Chang, Hsinchu (TW); Chih-Hsien Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 81 days.

(21) Appl. No.: 11/727,133

(22) Filed: Mar. 23, 2007

(65) Prior Publication Data

US 2008/0233765 A1 Sep. 25, 2008

(51) Int. Cl.
*H01L 21/4763* (2006.01)
*H01L 21/00* (2006.01)
(52) U.S. Cl. ............... 438/624; 438/798; 257/E21.584
(58) Field of Classification Search .............. 438/623, 438/624; 257/E21.584
See application file for complete search history.

(56) References Cited

U.S. PATENT DOCUMENTS

| | | | |
|---|---|---|---|
| 5,996,498 A * | 12/1999 | Lewis ........................ 101/467 |
| 6,410,457 B1 * | 6/2002 | M'Saad et al. .............. 438/778 |
| 6,593,247 B1 * | 7/2003 | Huang et al. ................. 438/758 |
| 2006/0166491 A1 * | 7/2006 | Ida .............................. 438/637 |
| 2006/0183317 A1 * | 8/2006 | Noguchi et al. ............. 438/629 |
| 2007/0148958 A1 * | 6/2007 | Clevenger et al. ........... 438/622 |

OTHER PUBLICATIONS

"3MS Trimethylsilane" Chemical Data Sheet, published 2006, www.airproducts.com/lok/dstremethylsilannesemigrade.pdf.*

* cited by examiner

*Primary Examiner*—Hsien-ming Lee
*Assistant Examiner*—Kevin Parendo
(74) *Attorney, Agent, or Firm*—Birch, Stewart, Kolasch & Birch, LLP (57) ABSTRACT

A novel method for enhancing interface adhesion between adjacent dielectric layers, particularly between an etch stop layer and an overlying dielectric layer having a low dielectric constant (k) in the formation of metal interconnects during the fabrication of integrated circuits on semiconductor wafer substrates. The method may include providing a substrate, providing an etch stop layer on the substrate, providing an oxygen-rich dielectric pre-layer on the etch stop layer and providing a major dielectric layer on the oxygen-rich dielectric pre-layer. Metal interconnects are then formed in the dielectric layers. The oxygen-rich dielectric pre-layer between the etch stop layer and the upper dielectric layer prevents or minimizes peeling and cracking of the layers induced by stresses that are caused by chemical mechanical planarization of metal layers and/or chip packaging.

6 Claims, 7 Drawing Sheets

METHOD FOR ENHANCING ADHESION BETWEEN LAYERS IN BEOL FABRICATION

BACKGROUND OF THE INVENTION

1. Field of the Invention

The present invention relates to BEOL (back-end-of-line) metal interconnects in integrated circuits fabricated on semiconductor wafer substrates. More particularly, the present invention relates to a method of enhancing interface adhesion between adjacent layers, particularly between a low-k dielectric layer and an etch stop layer in BEOL metal interconnect formation.

2. Description of the Related Art

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

In the semiconductor industry, copper is being increasingly used as the interconnect material for microchip fabrication. The conventional method of depositing a metal conducting layer and then etching the layer in the pattern of the desired metal line interconnects and vias cannot be used with copper because copper is not suitable for dry-etching. Special considerations must also be undertaken in order to prevent diffusion of copper into silicon during processing. Therefore, the dual-damascene process has been developed and is widely used to form copper metal line interconnects and vias in semiconductor technology. In the dual-damascene process, the dielectric layer rather than the metal layer is etched to form trenches and vias, after which the metal is deposited into the trenches and vias to form the desired interconnects. Finally, the deposited copper is subjected to chemical mechanical planarization (CMP) to remove excess copper (copper overburden) extending from the trenches.

A typical dual damascene process is shown in the cross-sectional views of FIGS. 1A-1D. The process is carried out on a substrate 100 on which a conductive metal layer 102 is deposited. A bottom dielectric layer 104, an etch stop layer 106 and an upper dielectric layer 108 are sequentially formed on the substrate 100. A photoresist layer 110 is then formed over the upper dielectric layer 108. Photolithography techniques are then used to pattern the photoresist layer 110 for subsequent formation of a via opening in the photoresist layer 110.

Figure 1A:
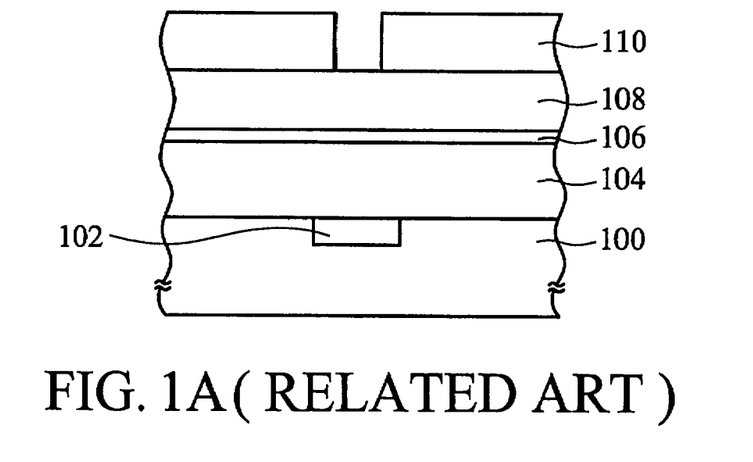
FIGS. 1A-1D are cross-sectional views illustrating sequential fabrication of a conventional dual damascene interconnect structure.
Figure 1B:
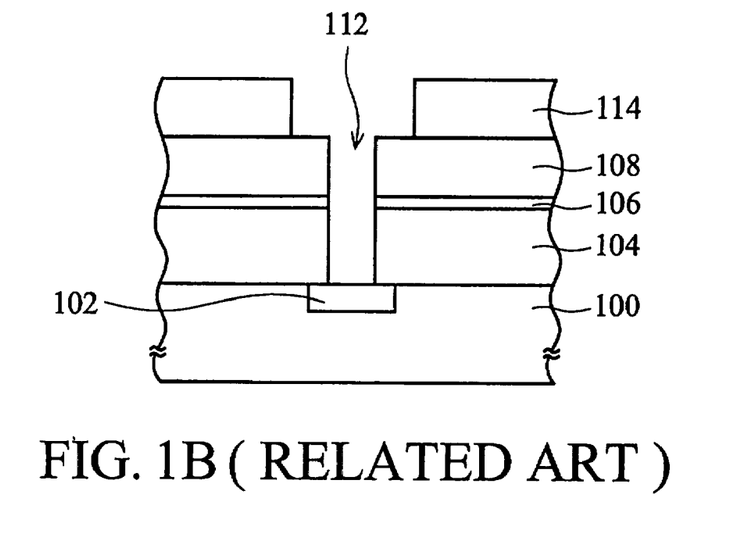

The photoresist layer 110 is used as an etching mask as the upper dielectric layer 108, the etch stop layer 106 and the bottom dielectric layer 104 are sequentially etched to form a via opening 112 through which the metal layer 102 is exposed, as shown in FIG. 1B. The photoresist layer 110 is removed and a second photoresist layer 114 is formed on the substrate 100, as shown in FIG. 1B. Photolithography techniques are then used to pattern the photoresist layer 114 for formation of a trench above the via opening 112.

Figure 1C:
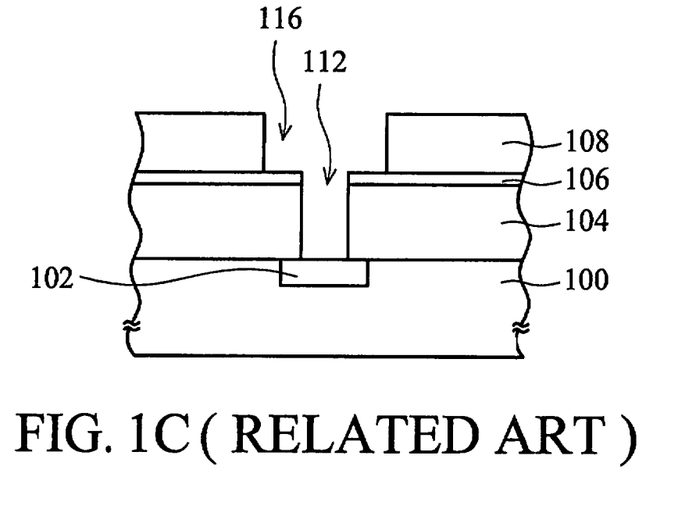
Figure 1D:
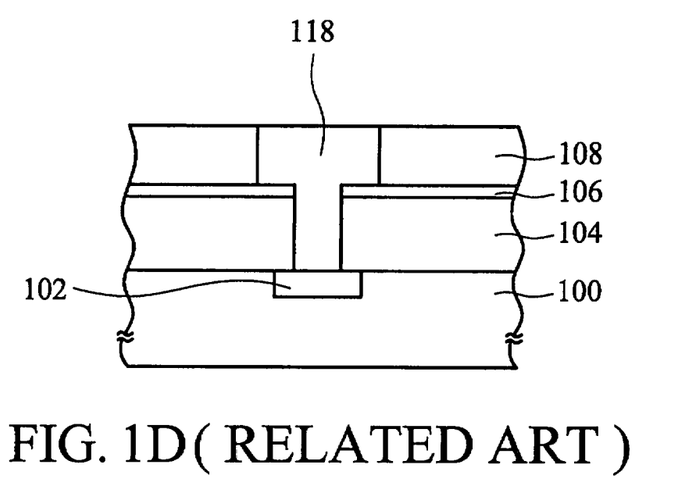

The photoresist layer 114 is used as an etching mask and the etch stop layer 108 as an etch stop as the upper dielectric layer 108 is etched to form a trench 116 over the via opening 112, as shown in FIG. 1C. The photoresist 114 is subsequently removed. Finally, as shown in FIG. 1D, a metallic layer 118 is deposited into the via opening 112 and overlying trench 116. The metallic layer 118 is subjected to chemical mechanical planarization (CMP) for the purpose of planarizing or smoothing the upper surface of the metallic layer 118.

When the gate length of ICs is less than about 0.18 mm, the propagation time or delay time is determined by interconnect delay rather than device gate delay. To address this problem, new materials with low dielectric constants (k) are being developed for use as dielectric layers in IC fabrication. The aim of this development effort is to reduce time constant (RC delay), power consumption and cross-talk in ICs. This development effort increases in importance as the gate length of ICs approaches 0.09 mm and beyond.

There are two basic groups of low-k dielectric materials: the traditional inorganic group, which includes silicon dioxide; and the newer group of organic polymers, which includes poly-para-xylene. Organic polymers are considered an improvement over inorganic low-k dielectric materials because the dielectric constant of organic polymers can be as low as 2.0. However, most of the currently-available organic polymers suffer from several disadvantages, including insufficient thermal stability and fragility.

While it is well-suited for planarization if the correct slurry and process parameters are used, CMP may induce physical stresses in the substrate, leading to cracking and peeling of dielectric layers, particularly at the interface of the upper dielectric layer with the etch stop layer. Moreover, due to the increasingly widespread usage of fragile low-k dielectric materials, CMP may result in shearing or crushing of these layers. In addition, stresses applied to the low-k dielectric layer during chip packaging can induce peeling and cracking of the layer.

BRIEF SUMMARY OF THE INVENTION

For 130 mm and beyond high-performance VLSI technology, combining low-k dielectrics and copper interconnects is important for reduced wiring propagation delay and power dissipation. Accordingly, a new technique is needed for providing enhanced interface adhesion particularly between an etch stop layer and an underlying adjacent low-k dielectric layer for BEOL (back-end-of-line) metal interconnect fabrication, in order to prevent or minimize cracking, peeling or other CMP-induced stresses imparted to the dielectric layer, such as during planarization of a metal layer filling a trench or via formed in the layer.

An object of the present invention is to provide methods which may be used to enhance interface adhesion between adjacent dielectric layers.

Another object of the present invention is to methods which may be used to prevent or at least minimize cracking, peeling and/or separation of adjacent layers deposited on a substrate, particularly as a result of stresses induced by chemical mechanical planarization and chip packaging.

Still another object of the present invention is to provide methods which are suitable for enhancing the structural integrity of metal interconnects formed in dielectric layers on a substrate.

Yet another object of the present invention is to provide methods which are suitable for enhancing inter-layer adhesion of dielectric layers having a low dielectric constant to prevent or at least minimize stress-induced peeling or cracking of the layers during processing and/or packaging.

A still further object of the present invention is to provide methods which are suitable for enhancing the inter-layer structural integrity between an etch stop layer and a dielectric layer having a low dielectric constant.

These and other objects and advantages of the present invention are provided in methods for enhancing interface adhesion between adjacent dielectric layers, particularly between an etch stop layer and an overlying dielectric layer having a low dielectric constant (k) in the formation of metal interconnects during the fabrication of integrated circuits on semiconductor wafer substrates. In an embodiment, the method may include providing a substrate, providing an etch stop layer on the substrate, providing an oxygen-rich dielectric pre-layer as an adhesive film on the etch stop layer and providing an upper dielectric layer on the oxygen-rich dielectric pre-layer. Metal interconnects are then formed in the dielectric layers. The oxygen-rich adhesive film between the etch stop layer and the upper dielectric layer prevents or minimizes peeling and cracking of the layers induced by stresses that are caused by chemical mechanical planarization of metal layers and/or chip packaging.

BRIEF DESCRIPTION OF THE DRAWINGS

The invention will now be described, by way of example, with reference to the accompanying drawings, in which.

DETAILED DESCRIPTION OF THE INVENTION

The present invention has particularly beneficial utility in the interfacial adhesion of a low-k dielectric layer to an etch stop layer prior to the fabrication of BEOL (back-end-of-line) metal interconnects in the layers in order to reinforce the layers during chemical mechanical planarization (CMP) and chip packaging. However, the invention may be more generally applicable to facilitating interfacial adhesion between adjacent dielectric layers of various description to each other in a variety of applications involving semiconductor processing, as well as in other industrial applications.

The present invention provides an oxide-rich dielectric pre-layer as an adhesive film between the etch stop layer and the major dielectric layer, which prevents or minimizes stress-induced peeling and cracking of the dielectric layer, particularly at the interface therebetween, during the CMP step and subsequent chip testing and packaging, for example. While the method may be used as a part of a dual damascene process for the fabrication of BEOL metal interconnects on a substrate, the invention is not limited to such dual damascene process and may be utilized in any application in which a dielectric layer is to be deposited on an etch stop layer or second dielectric layer.

In a preferred embodiment, an oxygen-rich adhesive dielectric pre-layer is deposited on an etch stop layer using a plasma-enhanced chemical vapor deposition (PECVD) process carried out in a PECVD process chamber. Accordingly, the wafer substrate, on which the etch stop layer was formed, is initially placed into the PECVD process chamber. Molecular oxygen is then introduced into the chamber until the chamber pressure reaches typically about 3.5 Torr. An oxygen plasma is ignited in the chamber, followed by introduction of the dielectric-forming precursor gas, along with a carrier gas, into the chamber. The carrier for the dielectric-forming precursor gas may be Ar, He, $CO_2$, CO, $N_2$ or any suitable inert gas. Preferably, the dielectric-forming precursor gas is the Black Diamond (BD) precursor trimethyl disilane, which is used to form a low-k dielectric layer.

Typical process parameters for the PECVD deposition process are as follows: chamber pressure—about 3.5 Torr; chamber temperature—about 335 degrees C.; RF source power—about 750 watts; and dielectric-forming precursor gas flow rate—1800 ($O_2$) sccm. The PECVD deposition process forms an oxygen-rich dielectric pre-layer having a thickness of typically at least about 50 angstroms, and preferably, about 50-100 angstroms.

The major dielectric layer can then be formed subsequently on the oxygen-rich pre layer. Preferably, the dielectric layer can be the Black Diamond (BD) organo-silicate glasses available from Applied Materials, Inc., of Santa Clara, Calif. The dielectric-forming precursor gas of the oxygen-rich dielectric pre-layer and the major dielectric layer is preferable the same for continuously formation in the same process chamber. Moreover, a wide range of proprietary low-k materials suitable for implementation of the invention include FLARE (Honeywell Electronic Materials) and SILK (Dow Chemical). Other examples include silicon dioxide and combinations of silicon dioxide and other doped dielectrics, such as FSG, BPSG and PSG, in non-exclusive particular.

Additional low-k dielectric materials may include but are not limited to spin-on and CVD polymeric materials based on silicon, carbon or combinations of silicon and carbon; organic thermoplastic and thermosetting polymers, such as polyimides, polyarylethers, benzocyclobutenes, polyphenylquinoxalines, and polyquinolines; inorganic and spin-on glass materials such as silsesquioxanes, silicates, and siloxanes; and mixtures or blends of organic polymers and spin-on glasses. Further examples of CVD low-k dielectric materials include polymers of parylene and napthalene, copolymers of parylene with polysiloxanes or teflon, and polymers of polysiloxane, in non-exclusive particular.

Figure 2A:
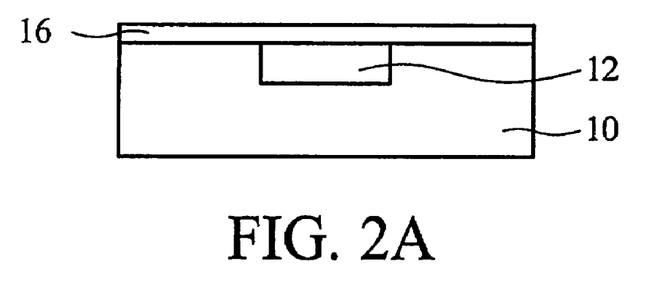
FIG. 2A is a cross-sectional view illustrating formation of an etch stop layer on a wafer substrate in a first process step according to the present invention.
Figure 2B:
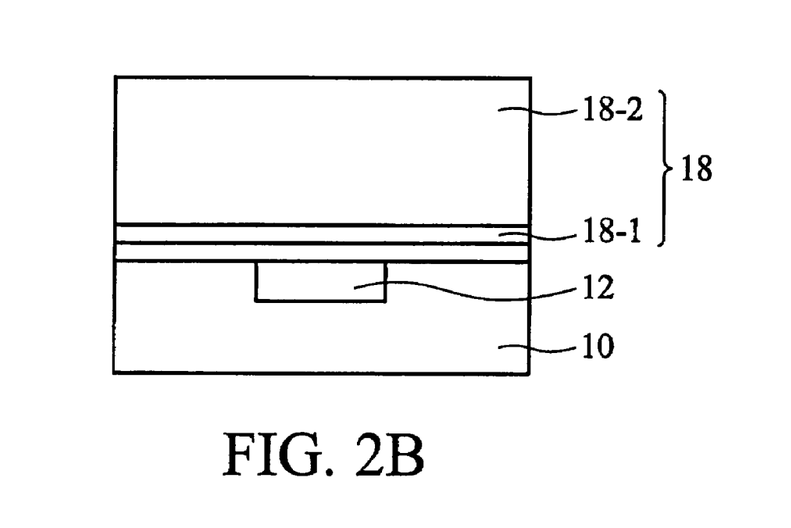
FIG. 2B is a cross-sectional view illustrating formation of an oxygen-rich dielectric pre-layer on the etch stop layer and then formation of a dielectric layer on the dielectric pre-layer of FIG. 2A in a second process step according to the present invention.

Referring to FIGS. 2A-2B, cross-sectional views illustrating a typical sequence of process steps in implementation of a preferred embodiment of the present invention are shown. As shown in FIG. 2A, the process of the present invention may be carried out on a wafer substrate 10 on which a conductive layer 12, such as copper for interconnection, is deposited. An etch stop layer 16 is then formed, covering the surface of the substrate 10 and the conductive metal layer 12.

As shown in FIG. 2B, according to the present invention, a dielectric layer 18 with an oxygen-rich adhesive pre-layer is then formed over the etch stop layer 16. The dielectric layer 18 is deposited on the etch stop layer 16 typically using a plasma-enhanced chemical vapor deposition (PECVD) process, as noted herein above. The process is carried out by placing the substrate 10 in a PECVD process chamber (not shown) and introducing pure molecular oxygen ($O_2$) into the process chamber until the chamber reaches an interior pressure of typically about 3.5 Torr. An oxygen plasma is then ignited in the process chamber using an RF source power of typically about 750 watts, at a process temperature of typically about 335 degrees C. The dielectric-forming precursor gas is then introduced into the process chamber at a flow rate of typically about 1800 ($O_2$) sccm. The precursor gas can be the Black Diamond (BD) precursor trimethyl disilane, which is also used for the subsequent major dielectric layer. The continuous plasma was found between these 2 processing. As it flows into the process chamber, the dielectric-forming precursor gas reacts with the oxygen plasma. This causes deposition of the oxygen-rich dielectric adhesive pre-layer 18-1 onto the upper surface of the etch stop layer 16. Upon depletion of the oxygen in the process chamber, further formation of the dielectric pre-layer 18-1 then stops. In a preferred embodiment, the oxygen-rich dielectric pre-layer 18-1 has a thickness of typically at least about 50 angstroms. Preferably, the oxygen-rich dielectric pre-layer 18-1 has a thickness of typically about 50-100 angstroms. Subsequently, the major low-k dielectric layer 18-2, such as a Black Diamond organosilicate glass available from Applied Materials, Inc, is then formed in the same PECVD process chamber with conventional deposition recipe. The same dielectric-forming precursor gas, such as trimethyl disilane, is then kept introducing into the process chamber. The thickness of the major low-k dielectric layer 18-2 depends on the structure requirements.

As shown in FIG. 2B, a low-k dielectric layer 18 is formed with an oxygen-rich dielectric pre-layer 18-1 and a major low-k dielectric layer 18-2. The major low-k dielectric layer can be accomplished by continued introduction of the dielectric-forming precursor gas into the process chamber after the depletion of the oxygen in the process chamber. Preferably, the oxygen-rich dielectric pre-layer 18-1 has an oxygen content which is at least about 15% higher than the oxygen content of the major dielectric layer 18-2. The oxygen-rich dielectric pre-layer 18-1 serves as a good adhesive film between the etch stop layer 16 and the major dielectric layer 18-2.

After formation of the oxygen-rich dielectric pre-layer 18-1 on the etch stop layer 16 and formation of the major low-k dielectric layer 18-2 on the oxygen-rich dielectric pre-layer 18-1, as heretofore described with respect to FIG. 2B, a metal interconnect structure may be fabricated using a dual damascene method. An example of such a method may be carried out by the sequential process steps shown in FIGS. 2C-2G.

Figure 2C:
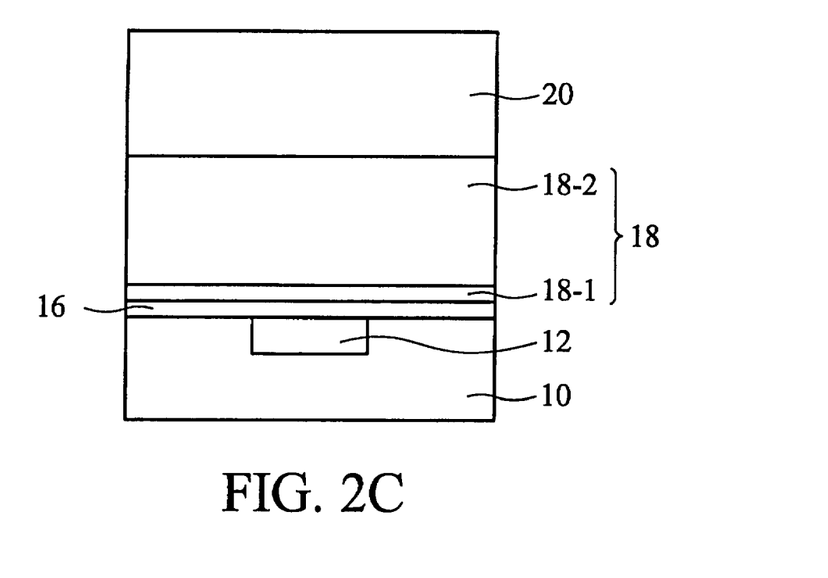
FIGS. 2C-2G are cross-sectional views illustrating sequential completion of a dual damascene metal interconnect structure.

As shown in FIG. 2C, a photoresist layer 20 is formed over the dielectric layer 18. The photoresist layer 20 is patterned using conventional photolithography techniques to provide photoresist openings 22 to be subsequently etched through the dielectric layer 18 and the etch stop layer 16, respectively.

Figure 2D:
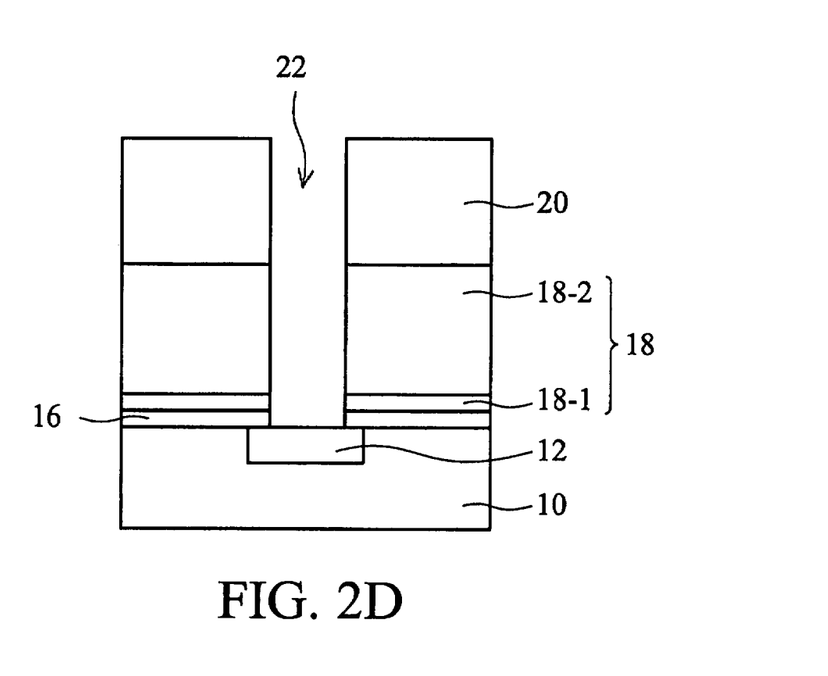

Next, the patterned photoresist layer 20 is used as an etching mask as the dielectric layer 18, and the etch stop layer 16 are sequentially etched to form a via opening 22 through which the metal layer 12 is exposed, as shown in FIG. 2D. The photoresist layer 20 of FIG. 2D is then stripped from the dielectric layer 18, after which a patterned trench photoresist layer 24 is similarly formed on the dielectric layer 18. Photolithography techniques are then used to pattern photoresist openings 26 in the photoresist layer 24 for formation of a trench opening above each via opening 22.

Figure 2E:
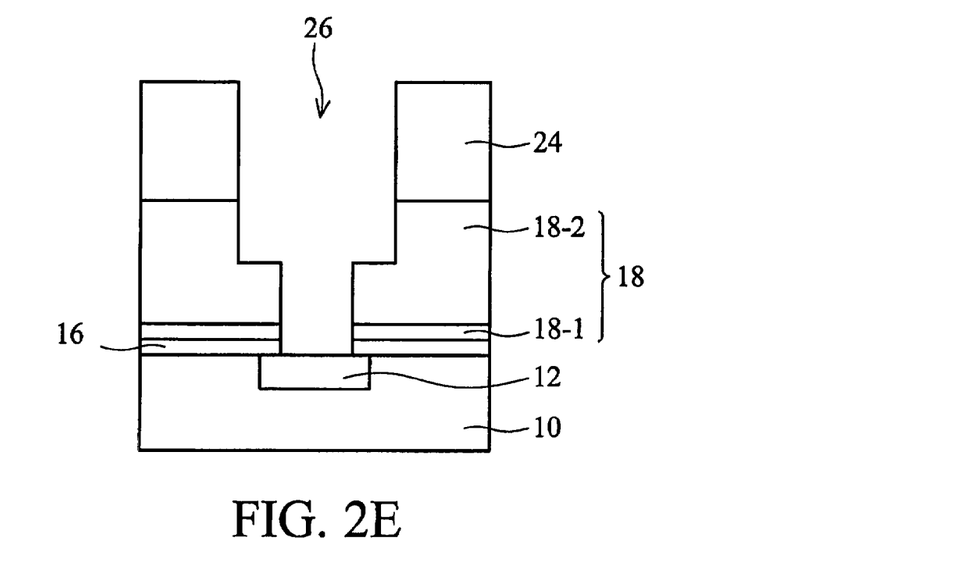

As shown in FIG. 2E, the patterned photoresist layer 24 is used as an etching mask as the dielectric layer 18 is etched to form a trench opening 26 over and in communication with the via opening 22. The trench photoresist layer 24 of FIG. 2E is subsequently stripped from the underlying dielectric layer 18.

Figure 2F:
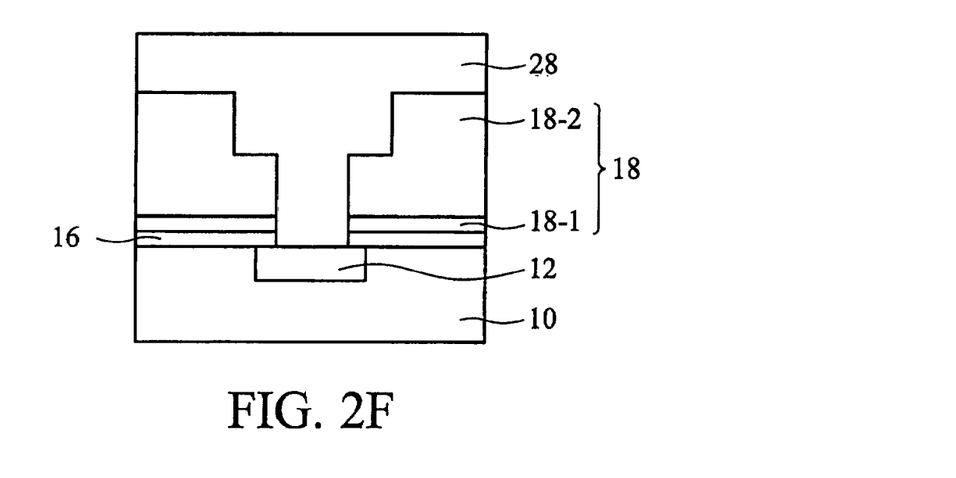

As shown in FIG. 2F, a conductive filling layer 28, typically copper, is deposited into the via opening 22 and trench opening 26. Finally, as shown in FIG. 2G, the conductive layer 28 is subjected to chemical mechanical planarization (CMP) for the purpose of planarizing or smoothing the upper surface of the conductive interconnect structure, as is known by those skilled in the art.

Figure 2G:
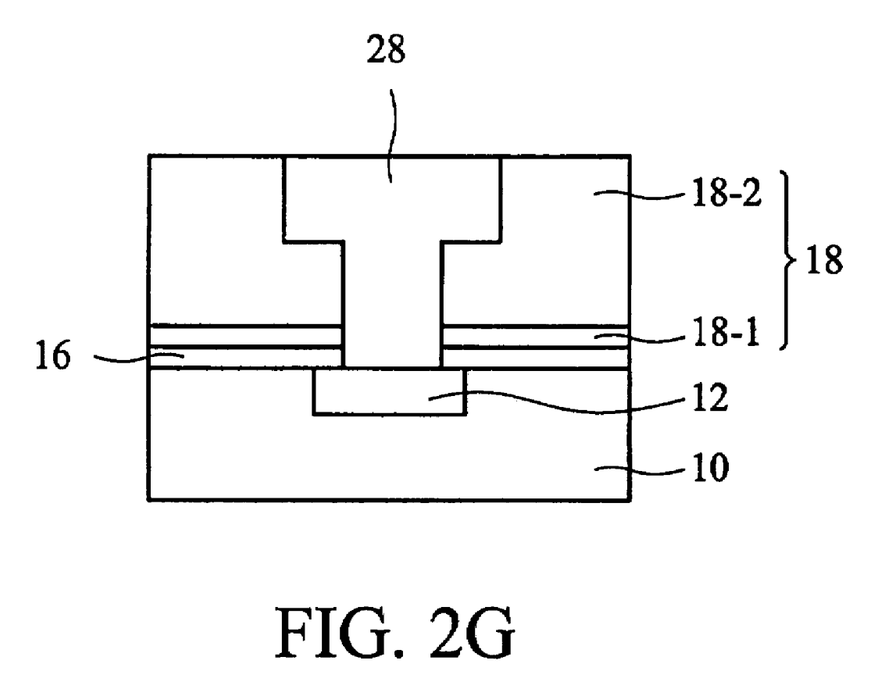

As further shown in FIG. 2G, the CMP process for planarization of the conductive layer 28 involves pressing of a CMP polishing pad against the surface of the conductive layer 28 with a downward force as the polishing pad is moved in a rotating or linear manner. This causes shear pressure to be exerted on the low-k dielectric layer 18. Accordingly, the oxygen-rich dielectric pre-layer 18-1 is effective in preventing or minimizing cracking and/or peeling of the dielectric layer 18, particularly at the interface between the dielectric layer 18 and the underlying etch stop layer 16, throughout the CMP and subsequent IC fabrication processes, including packaging of an IC chip which includes the metal interconnect structure.

Figure 3:
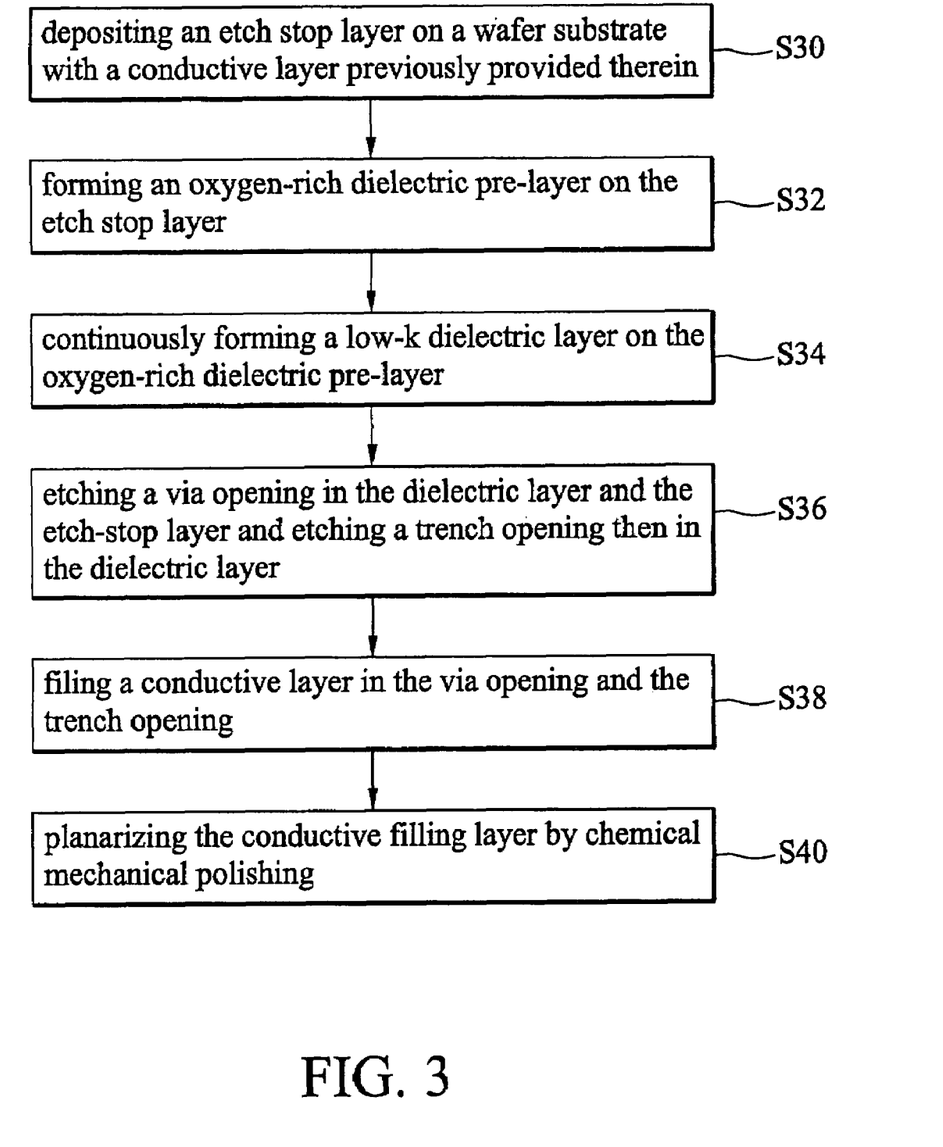
FIG. 3 is a flow diagram summarizing a typical process flow for implementation of the present invention.

A typical process flow of the method of the present invention is summarized in steps S30-S34 of the flow diagram in FIG. 3. In step S30, an etch stop layer is deposited on a conductive layer previously provided on a wafer substrate. In step S32, an oxygen-rich dielectric pre-layer is formed on the etch stop layer. In step S34, a low-k dielectric layer is continuously formed on the oxygen-rich dielectric pre-layer, preferably with the same dielectric-forming precursor gas.

A typical process flow illustrating sequential fabrication of a metal interconnect structure is summarized in steps S36-40 of FIG. 3. In step S36, a via opening is etched in the dielectric layer and the etch-stop layer and a trench opening is then etched in the dielectric layer. In step S38, a conductive filling layer is deposited in the via opening and the trench opening. In step S40, the conductive filling layer is subjected to chemical mechanical planarization, wherein the oxygen-rich dielectric pre-layer enhances the structural integrity between the dielectric layer and the etch stop layer to prevent or minimize cracking and/or peeling of the dielectric layer.

While the preferred embodiments of the invention have been described above, it will be recognized and understood that various modifications can be made in the invention and the appended claims are intended to cover all such modifications which may fall within the spirit and scope of the invention.

What is claimed is:

1. A method of enhancing interfacial adhesion between layers, comprising:
providing a substrate;
forming an etch-stop layer on the substrate;

providing pure molecular oxygen with a predetermined pressure and then igniting a pure oxygen plasma, followed by introducing a trimethyl disilane gas into the pure oxygen plasma, thus depositing an oxygen rich dielectric pre-layer on the etch-stop layer; and depositing a dielectric layer on the oxygen rich dielectric pre-layer by introducing the trimethyl disilane gas, wherein the oxygen rich dielectric pre-layer has an oxygen content higher than a second oxygen content of the dielectric layer.

2. The method of claim 1, wherein the oxygen rich dielectric pre-layer has a thickness of at least about 50 Angstroms.

3. The method of claim 1, wherein the dielectric layer comprises organosilicate glass.

4. The method of claim 3, wherein the oxygen rich dielectric pre-layer has a thickness of at least about 50 Angstroms.

5. The method of claim 1, wherein the pure molecular oxygen is provided with the predetermined pressure of about 3.5 Torr.

6. The method of claim 5, wherein the pure oxygen plasma is ignited at a source power of about 750 Watts.

* * * * *